United States Patent
Signer et al.

(10) Patent No.: US 11,769,974 B1
(45) Date of Patent: Sep. 26, 2023

(54) BUSBAR ADAPTER AND TEST STAND

(71) Applicant: ZT Group Int'l, Inc., Secaucus, NJ (US)

(72) Inventors: Ryan Signer, Secaucus, NJ (US); Vladimir Lipnevici, Secaucus, NJ (US); Kapil Rao Ganta Papa Rao Bala, Secaucus, NJ (US); Michael Dennis Marcade, Secaucus, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 260 days.

(21) Appl. No.: 16/910,631

(22) Filed: Jun. 24, 2020

(51) Int. Cl.
*H01R 25/14* (2006.01)
*G06F 1/26* (2006.01)
*G01R 31/28* (2006.01)

(52) U.S. Cl.
CPC ....... *H01R 25/145* (2013.01); *G01R 31/2817* (2013.01); *G06F 1/266* (2013.01)

(58) Field of Classification Search
CPC .... H01R 25/145; G01R 31/2817; G06F 1/266
See application file for complete search history.

(56) References Cited

U.S. PATENT DOCUMENTS

| | | | | |
|---|---|---|---|---|
| 5,268,637 A * | 12/1993 | Liken | ................ | G01R 31/2817 324/763.01 |
| 5,852,544 A * | 12/1998 | Lee | ........................ | G06F 1/266 361/825 |
| 6,526,515 B1 * | 2/2003 | Charles | ................ | G06F 1/1632 713/340 |
| 9,693,477 B1 * | 6/2017 | Ehlen | ................... | H05K 7/1492 |
| 2004/0252468 A1 * | 12/2004 | Chang | ..................... | G06F 1/187 361/752 |
| 2005/0237724 A1 * | 10/2005 | Fiorentino | .............. | G06F 1/189 361/752 |
| 2008/0141056 A1 * | 6/2008 | AbuGhazaleh | ......... | H04L 12/66 713/340 |
| 2014/0218858 A1 * | 8/2014 | Shelnutt | ................. | H05K 7/203 361/679.31 |
| 2015/0245531 A1 * | 8/2015 | Meinecke | .......... | H05K 7/20736 361/679.02 |
| 2020/0260608 A1 * | 8/2020 | Thibaut | ................ | H05K 7/1439 |

* cited by examiner

Primary Examiner — Travis S Chambers
(74) Attorney, Agent, or Firm — Dergosits & Noah LLP; Todd A. Noah

(57) ABSTRACT

An apparatus provides power for computer devices, such as servers, facilitating their testing outside of the typical server rack. A platform of supports the computer device while providing for a power supply unit beneath the platform to be connected to the device. The location of the power supply beneath the platform decreases the combined footprint of the apparatus and device under test. The power supply unit may be configured to connect to standard voltages, allowing the computer device to be tested where connection to rack-level voltage is not convenient.

12 Claims, 7 Drawing Sheets

BUSBAR ADAPTER AND TEST STAND

BACKGROUND

Rack servers that do not have internal power supplies have to be installed in a rack in order to be powered. The power typically comes from a centralized power source, such as a bus bar, that cannot be removed from the rack. As a result, such servers cannot be tested conveniently and safely on standard benchtop work surfaces. This complicates the testing of such systems both in the laboratory and in special test environments, such as in thermal and electromagnetic interference (EMI) chambers.

For example, to test a server that relies on a bus bar of a rack for power typically requires a custom rack, including a rack-level power source such as a powershelf with a power supply unit (PSU), and a power whip.

FIG. 1 is a front view of a custom server test rack 100. In FIG. 1, test rack 100 is a 10U rack, meaning it accepts 10 servers of a standard height of 1.75". Rack 100 includes a powershelf 102 that is bolted to a rear busbar (not shown) supplying power to each of the 10 rack locations (or 10U: 10 standard rack units). Powershelf 102 itself requires a PSU (not shown) that is connected to an external power supply by a whip 104. Whip 104 is particular to the PSU voltage requirement, which at 240/250V cannot use a standard wall outlet. Powershelf 102 is connected to rack 100 and an internal busbar (not shown), to which each device under test is connected for power. As shown empty, test rack 100 weighed approximately 160 lbs. and may exceed 200 lbs. when populated with devices, which may necessitate that it be moved using a pallet 106.

As a result, existing test racks suffer from drawbacks related to size, mobility, and power source configuration.

Thus, what is needed is an apparatus that allows rack devices to be powered without having to be installed a rack.

BRIEF DESCRIPTION OF THE DRAWINGS

The embodiments are illustrated by way of example and not limitation in the accompanying drawings, in which like references indicate similar elements, and in which.

DETAILED DESCRIPTION

In an embodiment, a stand-alone, portable test stand and power module provides a platform and a power supply for a device that enables the device to be tested under power without being installed in a rack. Embodiments may be particularly useful when systems have to be tested in small chambers, such as those used for thermal or environmental testing, and when space is generally limited, such as in a laboratory. In an embodiment, adapters may be included to reconfigure the test stand to power devices with different connectors. In an embodiment, a PSU is used that may be powered by a standard 110V wall outlet. In an embodiment, the power supply is included in a lower layer of the test stand and the device is supported on an upper layer of the test stand, which minimizes the footprint of the device under test. In an embodiment, a busbar for the multiple devices of a standard rack is downsized for use in a smaller format, e.g., for a single device, that may be powered using a portable power supply that can plug into a standard wall outlet or power distribution unit (PDU). Thus, embodiments provide the advantages of being easily portable, easy to power up, stand-alone, and reconfigurable for different devices.

Figure 1:
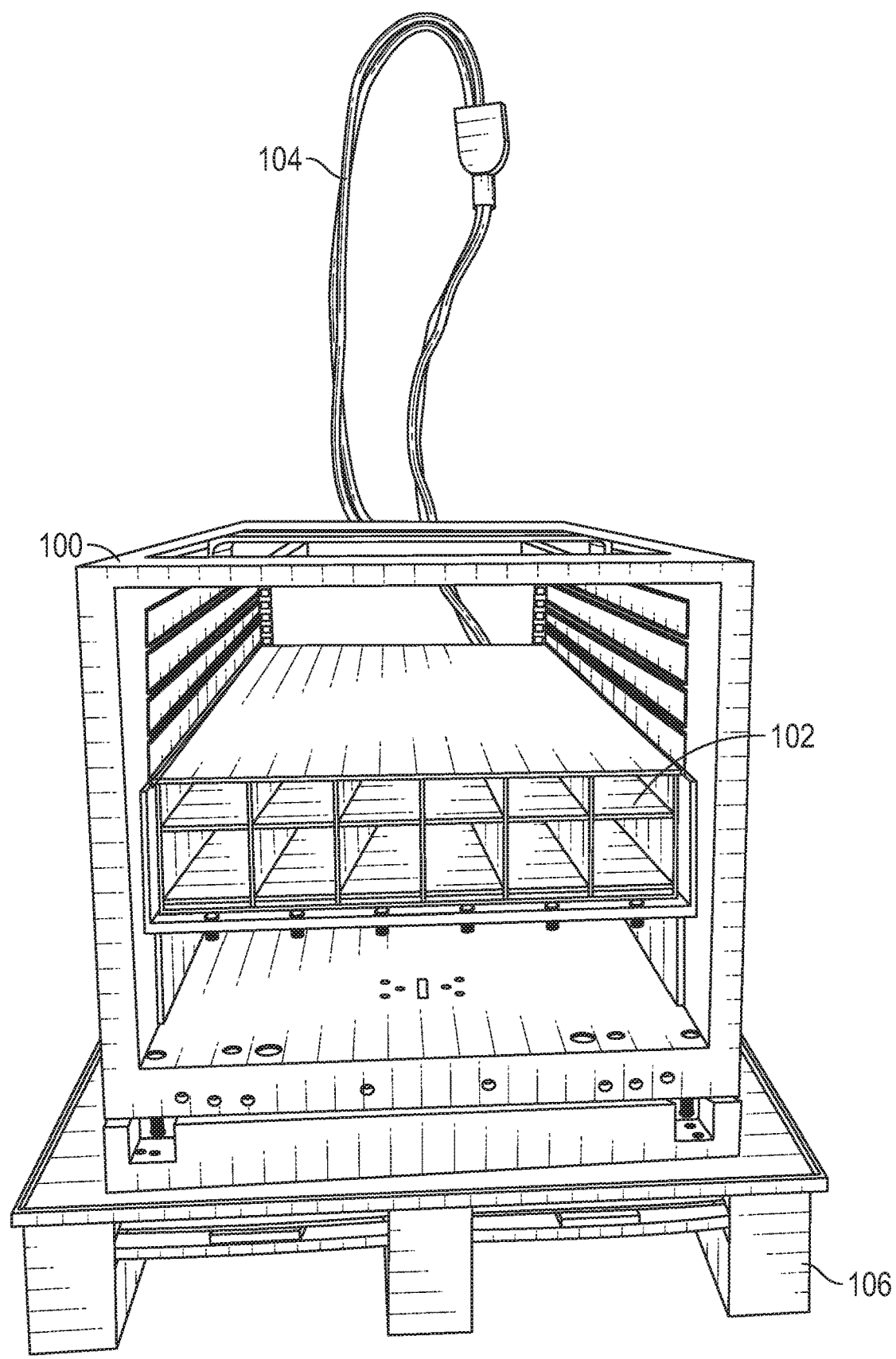
FIG. 1 is a front view of a custom server test rack.
Figure 2:
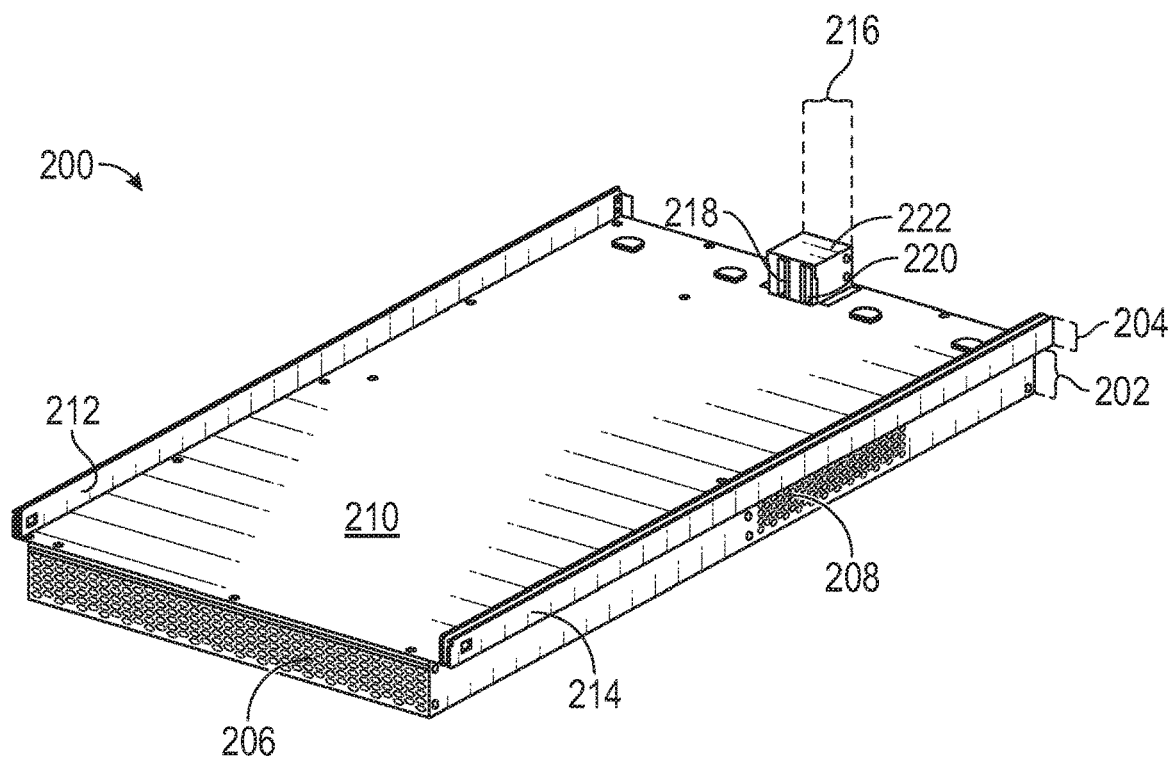
FIG. 2 is front-right perspective view of a busbar adapter and test stand according to an embodiment.

FIG. 2 is front-right perspective view of a busbar adapter and test stand according to an embodiment. In FIG. 2, a test stand 200 may include a lower section 202 and an upper section 204. Lower section 202 generally houses the electronics that receive and adapt the source power for a device under test. Lower section 202 also supports upper section 204. The electronics within lower section are cooled in part by vents 206 and 208. Upper section 204 includes a platform 210, for supporting a device under test, and with fences 212, 214 at the periphery, for retaining or limiting the movement of a device on the platform. A connector, e.g., a busbar connector 216 for a single device, includes rails 218, 220 for providing power to a device. Rails 218, 220 are covered by a shield 222 for safety. Shield 222 covers rails 218, 220 on the right, left, top, and rear sides, and may include additional insulation for safety. With the electronics situated beneath the platform, the footprint of test stand 200 is minimized, which makes test stand 200 convenient for using when testing devices in limited spaces.

Figure 3:
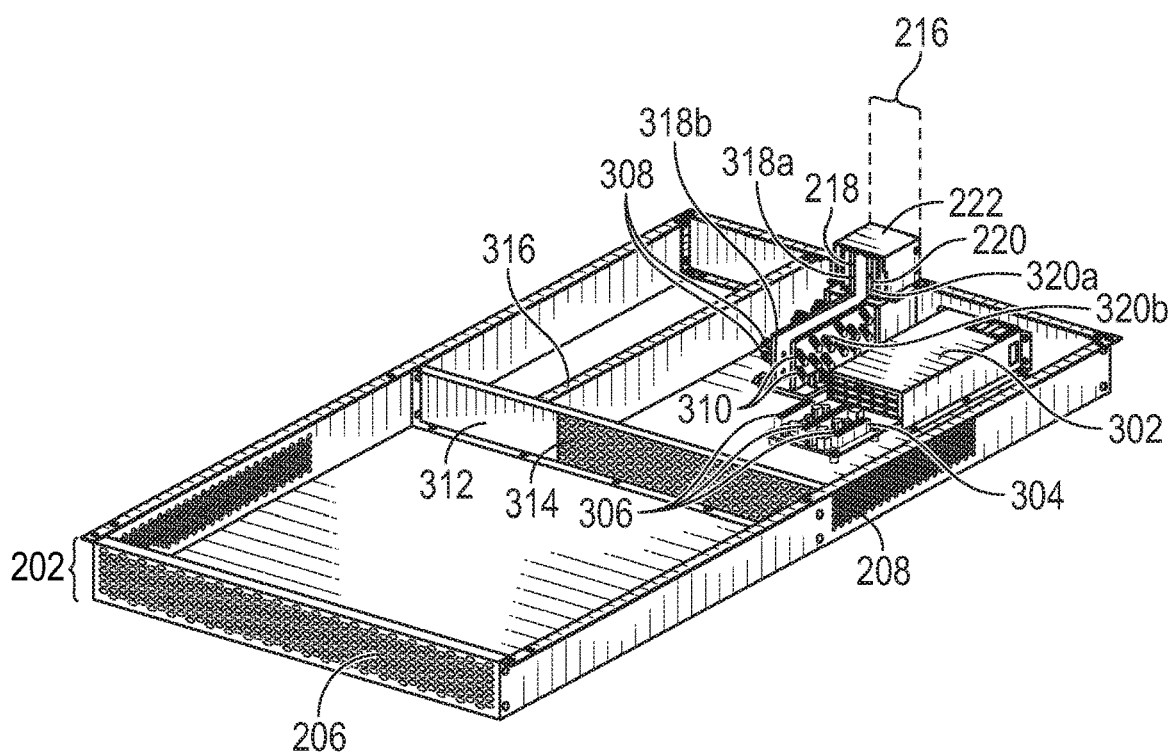
FIG. 3 is front-right perspective view of inner details of busbar adapter and test stand according to an embodiment of FIG. 2.

FIG. 3 is front-right perspective view of inner details of busbar adapter and test stand according to the embodiment of FIG. 2. In FIG. 3, test stand 200 has had upper section 204 removed, providing a view into lower section 202. Lower section 202 may include a power supply unit (PSU) 302 connected to a power distribution board (PDB) 304. PSU 302 may be connected to a power source, such as a standard wall socket using a power cord with a standard wall plug 402. PDB 304 and busbar connector 216 may be connected to rails 218, 220 of connector 216 with one group of PDB connections 306 being connected to a lower busbar rail section 318b using connectors 308, and another group of PDB connections 306 being connected to a lower busbar rail section 320a using connectors 310. Upper busbar rails 318a, 320a have corresponding lower busbar sections 318b, 320b, with the combination of lower and upper busbar sections forming busbars 218, 220. In the embodiment, L-shape of the combination of lower and upper busbar sections provides a lower section with enough surface area for a large number of connections while keeping the height of lower section 202 relatively minimal. Lower section 202 may further include trusses 312, 316, which provide internal support. Truss 312 may include vent 314 for cool air intake.

In an embodiment, PSU 302 may be swapped with PSUs of different ratings to adapt test stand 200 to power different devices. Similarly, in an embodiment, PDB 304 may be swapped with PDBs of different configurations to correspond to different PSUs and adapt test stand 200 to power different devices.

In an embodiment, rails 218, 220 may be connected directly to PSU 302, eliminating the need for a PDB 304.

Figure 4:
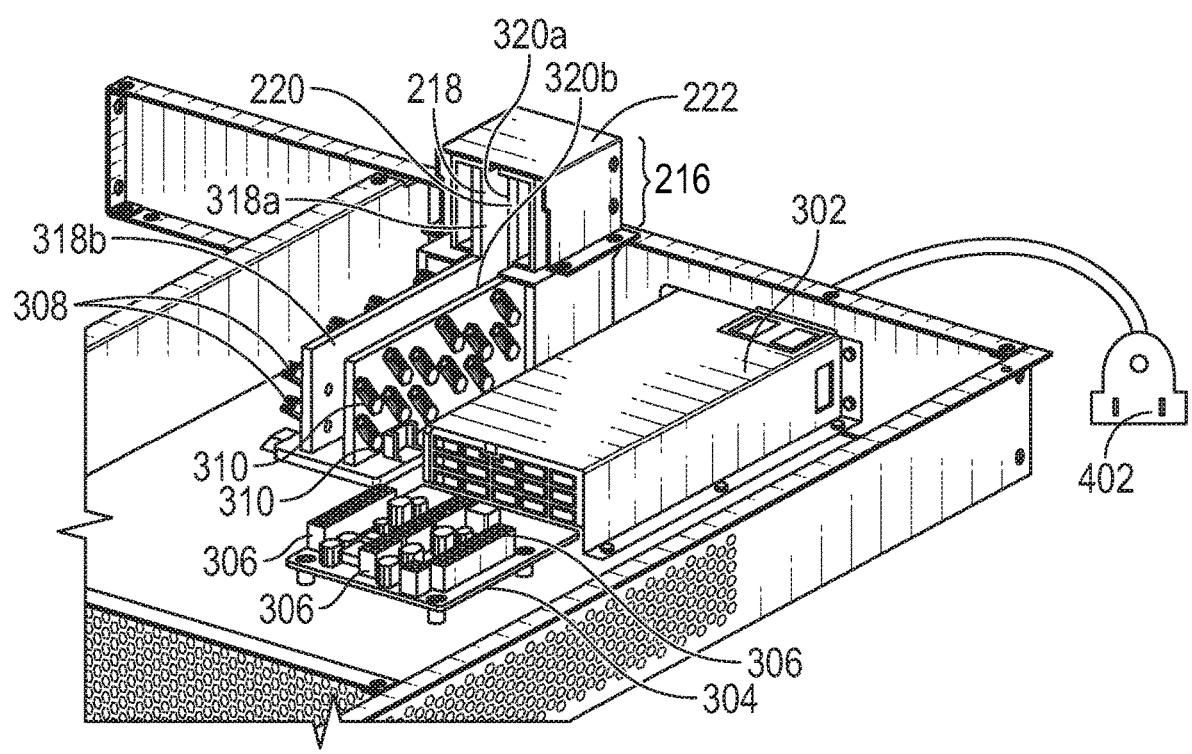
FIG. 4 is front-right perspective view of an enlarged section of FIG. 3.

FIG. 4 is front-right perspective view of an enlarged section of FIG. 3. FIG. 4 shows busbars rails 218, 220, busbar connections 308, 310, and connectors 306 of PDB 304 in further detail.

Figure 5:
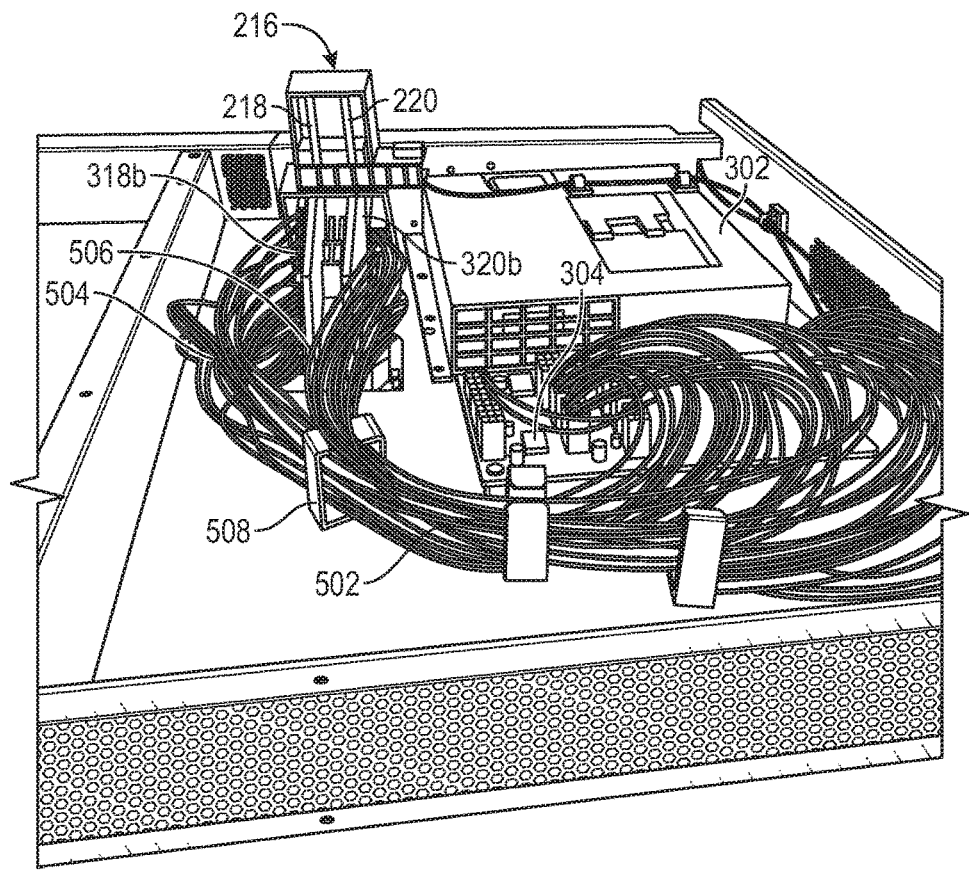
FIG. 5 is a side perspective view of a section of the busbar adapter and test stand according to the embodiment of FIG. 2.

FIG. 5 is a side perspective view of a section of the busbar adapter and test stand according to the embodiment of FIG. 2. In FIG. 5, a wire bundle 502 connects PDB 304 and busbar connector 216. Of bundle 502, a first bundle 504 is connected to rail section 318b and a second bundle 506 is connected to rail section 320b. Bundles 504, 506 may be held in place using retainers 508.

Figure 6:
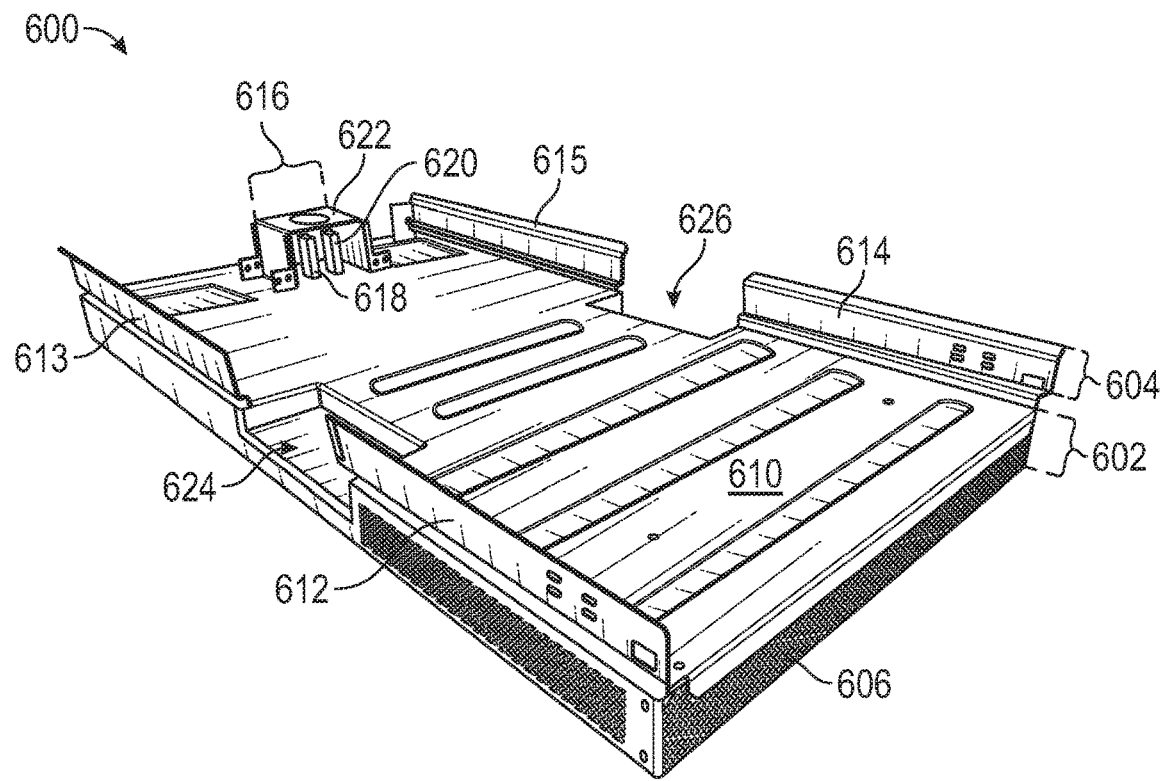
FIG. 6 is front-left perspective view of a busbar adapter and test stand according to an embodiment.

FIG. 6 is front-left perspective view of a busbar adapter and test stand according to an embodiment. In FIG. 6, a power module and test stand 600 includes a lower section 602 and an upper section 604. Upper section 604 includes a test platform 610 with fences 612, 613, 614, 615, for retained or limiting the movement of a device under test. Upper section 604 includes a busbar connector 616 including rails 618, 620 and a shield 622 covering rails 618, 620 on all sides except the front. Below platform 610, busbar 616 and the associated electronics may be as described with reference to busbar 216 and test stand 200. Platform 610 may include recesses 624, 626 which provide access to the bottom of a device under test and facilitate the lifting of the device from the platform. Lower section 602 may also include vents 606, 608. Lower section 602 may include cutouts adapted to accommodate recesses 624, 626.

Figure 7:
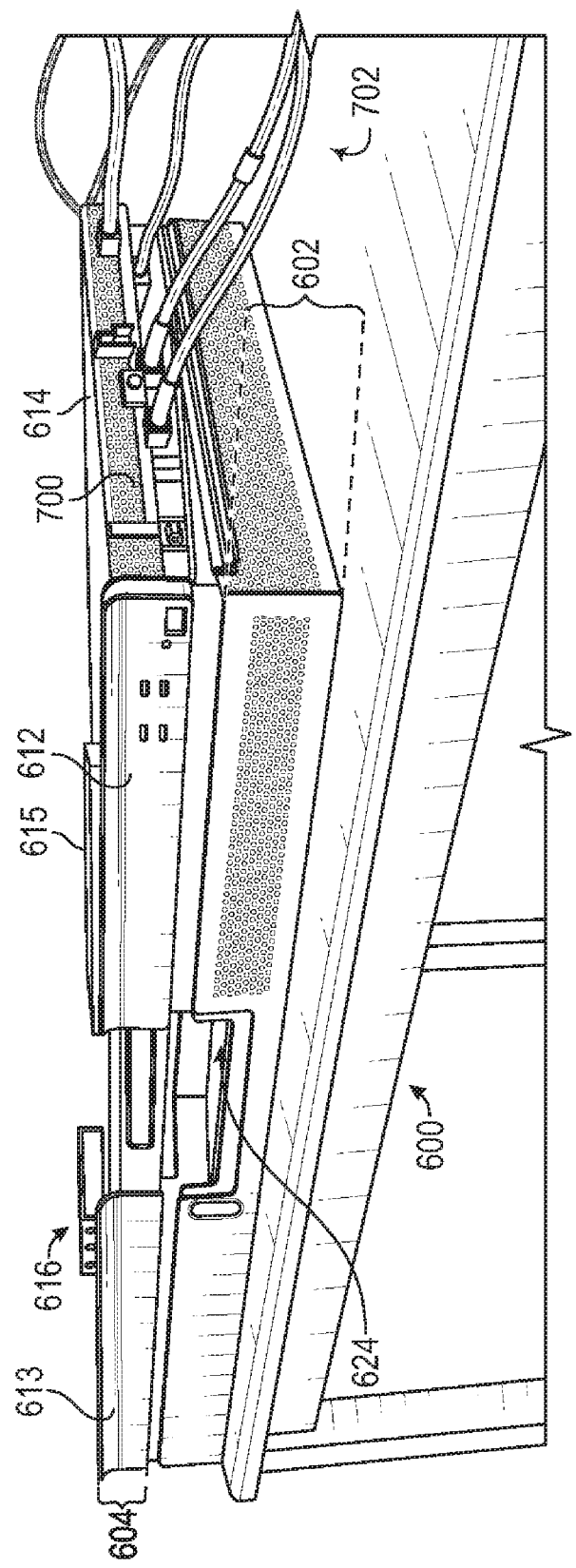
FIG. 7 is a front-left view of the busbar adapter and test stand according to the embodiment of FIG. 6 connected to a computing device.

FIG. 7 is a front-left view of the busbar adapter and test stand according to the embodiment of FIG. 6 connected to a computing device 700. In FIG. 7 device under test 700 includes a connector (not shown) that is directly mated to busbar connector 616 of test stand 600. Device 700, with power supplied by busbar connector 616 is being tested using wiring 702. With device 700 covering platform 610, recess 624 provides an access that facilitates the removal of device 700 from test stand 600.

Figure 8:
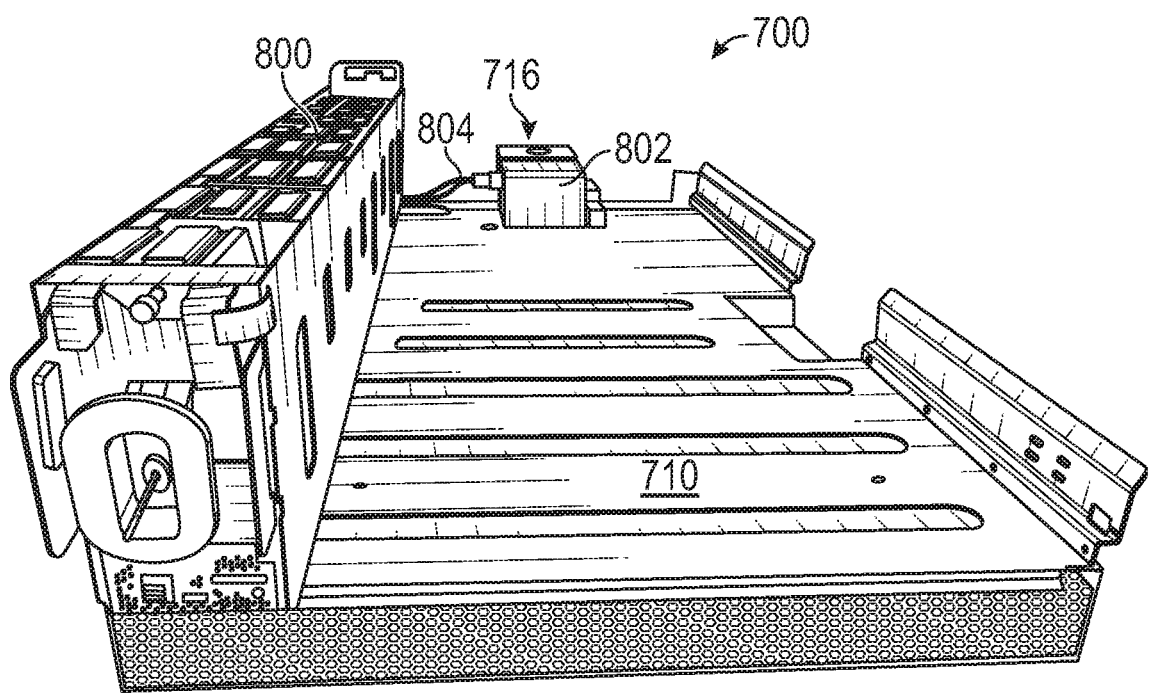
FIG. 8 is a front perspective view of the busbar adapter and test stand according to the embodiment of FIG. 6 connected to a computing device.

FIG. 8 is a front perspective view of the busbar adapter and test stand according to the embodiment of FIG. 6 connected to a computing device 800. In FIG. 8 the geometry and connector of device under test 800 is significantly different from those of device 700. Device 800 includes a connector (not shown) that is indirectly mated to busbar connector 616 of test stand 600 using an adaptor 802 and adaptor wiring 804. As before, recess 624 provides an access that facilitates the lifting of device 800 from test stand 600.

Figure 9:
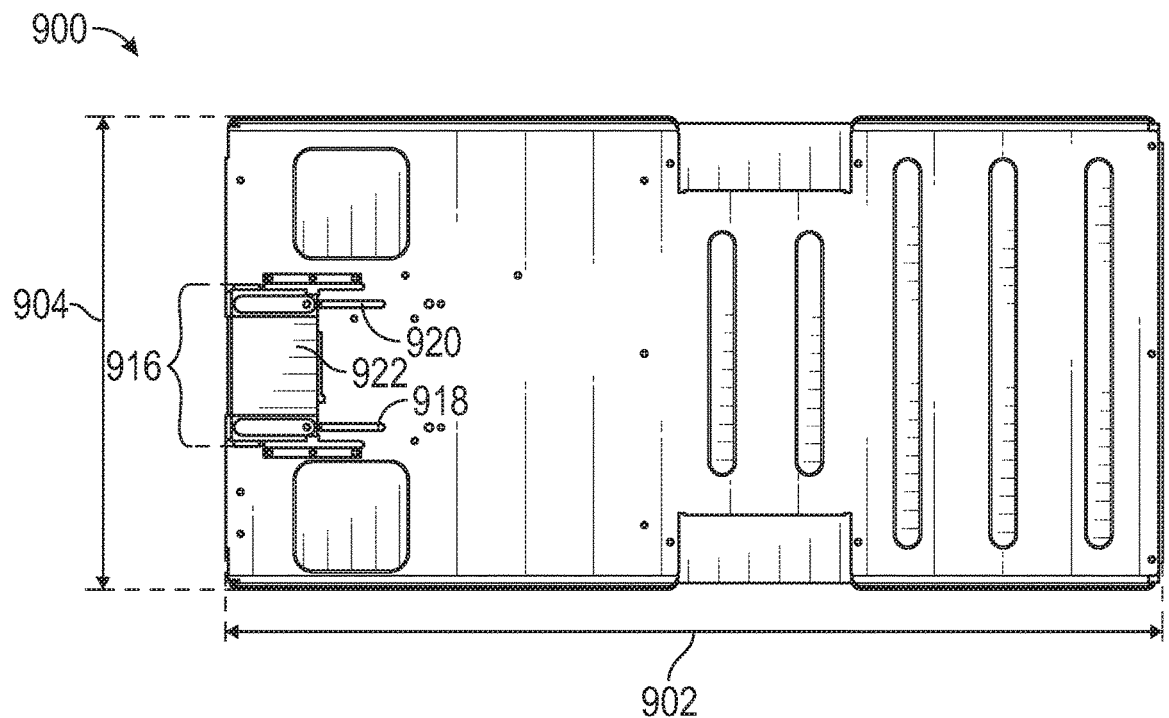
FIG. 9 is a top view of the busbar adapter and test stand according to an embodiment.

FIG. 9 is a top view of a busbar adapter and test stand according to an embodiment. In FIG. 9, a test stand 900 may have internal electronics and a platform as described with reference to FIG. 6. The platform of test stand 900 may be dimensioned with a length 902 of approximately 1019 mm and a width 904 of approximately 536 mm. Test stand 900 may have a connector 916 with rails 918, 920 covered by a shield 922. In the embodiment, rails 918, 920 may be configured differently from previous embodiments. For example, rails 918, 920 may be spaced further apart and extend forward, from under shield 922. Connector 916 is an example showing that in embodiments the connector for a test stand may be configured as required to mate to a connector of a device without departing from the teachings of the embodiments.

Figure 10:
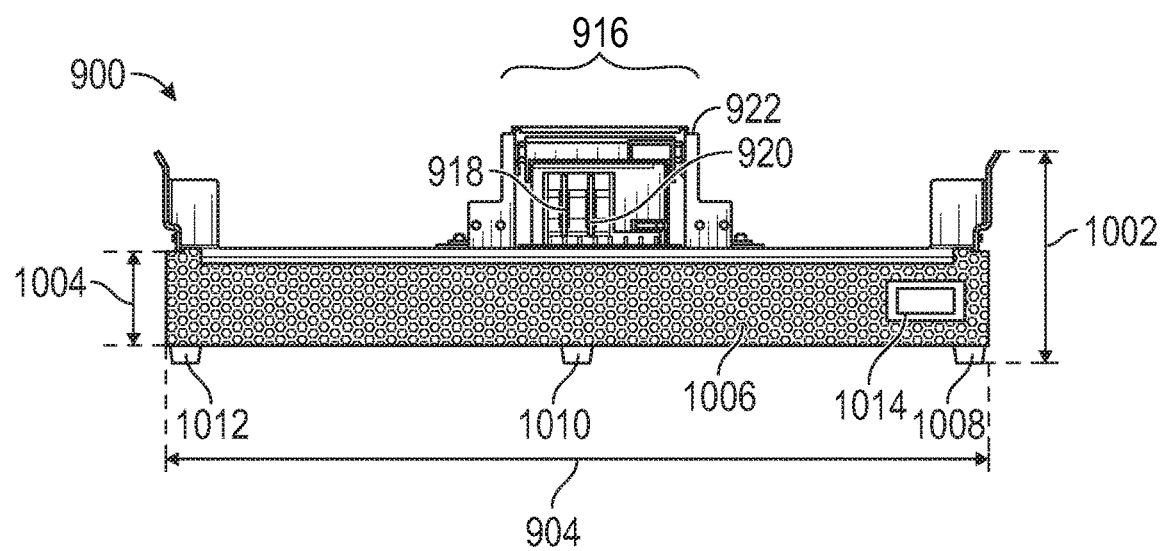
FIG. 10 is a front view of the busbar adapter and test stand according to the embodiment of FIG. 9.

FIG. 10 is a front view of the busbar adapter and test stand according to the embodiment of FIG. 9. In FIG. 10, test stand 900 may have a height 1002 at the fence of approximately 138 mm, with the height 804 of lower section at approximately 75 mm. The lower section may include a vent 1006 with a readout 1014 displaying data such as, e.g., the power being drawn. Test stand 900 may further include feet 1008, 1010, 1012 for stability.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:
   a support structure;
   a power supply unit (PSU);
   a platform; and
   a first connector with a first terminal and a second terminal connected to the PSU, the first terminal including a first busbar having a first lower section and a first upper section, the second terminal including a second busbar parallel to the first busbar and having a second lower section and a second upper section, wherein, when the platform is oriented horizontally:
   the support structure is configured to support the platform;
   the platform defines a footprint and the PSU is positioned within the footprint;
   the PSU is positioned below the platform; and
   the first connector extends from below the platform to above the platform with the first lower section and the second lower section being positioned below the platform and the first upper section and the second upper section extending above the platform.

2. The apparatus of claim 1, wherein the PSU is configured to be supplied with a supply voltage equal to or less than 220 volts.

3. The apparatus of claim 1, wherein the first lower section and the second lower section are positioned within a space defined by the platform and the support structure.

4. The apparatus of claim 3, wherein the PSU is connected to the first terminal at the first lower section and is connected to the second terminal at the second lower section.

5. The apparatus of claim 4 further including a shroud with an open side, wherein the first upper section and the second upper section are covered by the shroud such that the first upper section and second upper section are accessible only through the open side.

6. The apparatus of claim 5 wherein the first upper section and the first lower section connect to form a right angle and the second upper section and the second lower section connect to form a right angle.

7. The apparatus of claim 6 further including a second connector, wherein the second connector, when connected to the first connector, covers the first upper section and second upper section such that a further connection to the first upper section and the second upper section is prevented.

8. The apparatus of claim 6, wherein the first upper section and the second upper section extend above the platform less than or equal to one rack unit.

9. The apparatus of claim 1 further comprising a first fence on a first side of the platform and a second fence on a second side of the platform.

10. The apparatus of claim 9 further comprising a first recess at the first side of the platform and a second recess at the second side of the platform, the first recess and second recess providing access to a bottom side of a device otherwise supported by the platform.

11. The apparatus of claim 10, wherein:
the support structure includes a frame configured to support the platform at a periphery of the platform;
the platform is at least nineteen inches wide; and
the first recess includes a first void in the frame and a second void in the first fence and the second recess includes a third void in the frame and a fourth void in the second fence.

12. The apparatus of claim 11, wherein:
the frame encloses a space;
the PSU is located within the space; and
the frame includes a vent.

\* \* \* \* \*